US008463571B2

(12) United States Patent
Abbaspour et al.

(10) Patent No.: US 8,463,571 B2
(45) Date of Patent: Jun. 11, 2013

(54) PERFORMING RELIABILITY ANALYSIS OF SIGNAL WIRES

(75) Inventors: Soroush Abbaspour, Ossining, NY (US); Ayesha Akhter, Austin, TX (US); Peter Feldmann, NY, NY (US); Joachim Keinert, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 12/944,892

(22) Filed: Nov. 12, 2010

(65) Prior Publication Data

US 2012/0123725 A1    May 17, 2012

(51) Int. Cl.
*G06F 19/00* (2006.01)
*G01R 19/00* (2006.01)

(52) U.S. Cl.
USPC ............. 702/117; 702/61; 702/64; 716/113

(58) Field of Classification Search
USPC ........ 702/57, 60, 61, 64–66, 77, 117; 377/49; 716/109, 112, 113, 115, 130
See application file for complete search history.

(56) References Cited

U.S. PATENT DOCUMENTS

| | | | |
|---|---|---|---|
| 4,516,008 A | 5/1985 | Jones | |
| 4,658,323 A | 4/1987 | Dougherty | |
| 4,741,002 A | 4/1988 | Dougherty | |
| 5,822,218 A | 10/1998 | Moosa et al. | |
| 5,995,732 A | 11/1999 | Murai | |
| 6,072,945 A | 6/2000 | Aji et al. | |
| 6,249,898 B1 | 6/2001 | Koh et al. | |
| 6,370,414 B1 | 4/2002 | Robinson | |
| 6,532,570 B1 | 3/2003 | Mau | |
| 6,857,113 B2 | 2/2005 | Gentry et al. | |
| 6,880,139 B2 | 4/2005 | Mau et al. | |

OTHER PUBLICATIONS

Agarwal et al., "Efficient Computation of Current Flow in Signal Wires for Reliablility Analysis", IEEE/ACM International Conference on Computer Aided Design, 2007, pp. 741-746.

*Primary Examiner* — John H Le
(74) *Attorney, Agent, or Firm* — Gibb & Riley, LLC; Richard M. Kotulak, Esq.

(57) ABSTRACT

A computer-implemented system, method, and storage device simulate a periodic voltage waveform in a network model of the integrated circuit design. The method then determines resultant current values in each segment of nets of the integrated circuit design resulting from the periodic voltage waveform and performs a Fourier transform of the periodic voltage waveform to generate a frequency domain representation of the periodic voltage waveform. The frequency domain representation comprises multiple Fourier terms, each of the Fourier terms is a frequency that is a multiple of the base frequency. Next, the method performs an AC analysis of the resultant voltage at each frequency of the multiple Fourier terms. The AC analysis provides an electrical current value for each of the frequencies of the Fourier terms for each of the nets. This allows the method to compute a root mean square current through each of the nets based on the AC analysis. Then, the method determines whether the root mean square current for any of the segments of the nets exceeds a current limit, and reports any segment of the nets for which the root mean square current exceeds the current limit.

20 Claims, 7 Drawing Sheets

PERFORMING RELIABILITY ANALYSIS OF SIGNAL WIRES

BACKGROUND

The present invention relates to reliability analysis of an integrated circuit design, and more specifically, to methods and systems that efficiently compute the root mean square (RMS) currents on the VLSI circuit wires and checks whether current limits are exceeded.

Increasing power densities and shrinking interconnects within integrated circuit designs results in increasing current density demands. This increases the concerns for local heating and local temperature gradients which have significant impact on the reliability of very large scale integration (VLSI) circuits, in particular electro-migration. Joule heating that results in temperature gradients in the conductor is more effective in reducing lifetime than the increase in temperature alone would suggest.

Reliability of integrated circuit designs are usually evaluated with a simulator, such as SPICE (Simulation Program with Integrated Circuit Emphasis) which is a general-purpose open source analog electronic circuit simulator that is used in integrated circuit and board-level design to check the integrity of circuit designs and to predict circuit behavior.

SUMMARY

Disclosed herein is a computer-implemented method for performing reliability analysis of an integrated circuit design. More specifically, the method efficiently computes the root mean square (RMS) currents on the VLSI circuit wires and checks whether current limits are exceeded. The method is performed using a computerized device and simulates a periodic voltage waveform in a network model of the integrated circuit design. The method then determines resultant current values in each segment of nets of the integrated circuit design (resulting from the periodic voltage waveform) and performs a Fourier transform of the periodic voltage waveform to generate a frequency domain representation of the periodic voltage waveform. The frequency domain representation comprises multiple Fourier terms, each of the Fourier terms comprise a frequency that is a multiple of the base frequency. Next, the method performs an AC analysis of the resultant voltage at each frequency of the multiple Fourier terms. The AC analysis provides an electrical current value for each of the frequencies of the Fourier terms for each of the nets. This allows the method to compute a root mean square current through each of the nets based on the AC analysis. Then, the method determines whether the root mean square current for any of the segments of the nets exceeds a current limit, and reports any segment of the nets for which the root mean square current exceeds the current limit.

Another method herein simulates a periodic voltage waveform in a network model of the integrated circuit design. The method then determines resultant current values in each segment of the nets of the integrated circuit design resulting from the periodic waveform and performs a transform of the periodic waveform to generate a frequency domain representation of the periodic waveform. The frequency domain representation comprises multiple terms, each of the terms comprise a frequency that is a multiple of the base frequency. Next, the method performs an AC analysis of the resultant voltage at each frequency of the multiple terms. The AC analysis provides an electrical current value for each of the frequencies of the terms for each of the nets. This allows the method to compute a root mean square current through each of the nets based on the AC analysis.

An additional embodiment herein is a system for performing a reliability analysis of an integrated circuit design. The system comprises a power supply, and a non-transitory computer readable storage medium operatively connected to the power supply. The non-transitory computer readable storage medium stores instructions and an integrated circuit design. The system also includes a communications port operatively connected to the power supply and a processor operatively connected to the power supply, to the non-transitory computer readable storage medium, and to the communications port. The processor executes the instructions to simulate a periodic voltage waveform in a network model of the integrated circuit design. The processor executes the instructions to determine resultant current values in each segment of the nets of the integrated circuit design resulting from the periodic voltage waveform and performs a Fourier transform of the periodic voltage waveform to generate a frequency domain representation of the periodic voltage waveform. The frequency domain representation comprises multiple Fourier terms, each of the Fourier terms comprise a frequency that is a multiple of the base frequency. Next, the processor executes the instructions to perform an AC analysis of the resultant voltage at each frequency of the multiple Fourier terms. The AC analysis provides an electrical current value for each of the frequencies of the Fourier terms for each of the nets. This allows the processor to execute the instructions to compute a root mean square current through each of the nets based on the AC analysis. Then, the processor executes the instructions to determine whether the root mean square current for any of the segments of the nets exceeds a current limit, and reports any segment of the nets for which the root mean square current exceeds the current limit.

An additional embodiment herein is a non-transitory computer storage medium storing instructions executable by a computer. The instructions cause the computer to perform a method for a reliability analysis of an integrated circuit design. The method simulates a periodic voltage waveform in a network model of the integrated circuit design. The method then determines resultant current values in each segment of the nets of the integrated circuit design resulting from the periodic voltage waveform and performs a Fourier transform of the periodic voltage waveform to generate a frequency domain representation of the periodic voltage waveform. The frequency domain representation comprises multiple Fourier terms, each of the Fourier terms comprise a frequency that is a multiple of the base frequency. Next, the method performs an AC analysis of the resultant voltage at each frequency of the multiple Fourier terms. The AC analysis provides an electrical current value for each of the frequencies of the Fourier terms for each of the nets. This allows the method to compute a root mean square current through each of the nets based on the AC analysis. Then, the method determines whether the root mean square current for any of the segments of the nets exceeds a current limit, and reports any segment of the nets for which the root mean square current exceeds the current limit.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

As mentioned above, concerns for local heating and local temperature gradients have a significant impact on reliability of very large scale integration (VLSI) circuits, in particular electro-migration. Joule heating that results in temperature gradients in the conductor is more effective in reducing lifetime than the increase in temperature alone would suggest. For example, Irms (root mean square of the current) limit can restrict Joule heating to as little as 5° C. above junction temperature.

In view of these issues, the embodiments herein provide methods to efficiently compute the root mean square (RMS) currents on the VLSI circuit wires and check whether current limits are exceeded in an AC analysis when simulating the performance of the circuit using a simulator, such as SPICE and its prodigy, mentioned above. The embodiments herein identify Irms violations on neighboring lines, which allows the electromigration on the net of interest to be prevented. A violation is reported if the calculated Irms is higher than the maximum Irms limit of process technology provided by a design manual. This saves signal wires from future EM problems.

One possible Irms calculation is to perform transient analysis and calculate Irms of the current in the signal wire and/or via. This can be done by performing transient analysis for a few clock periods, generally 10 cycles, (since the current needs to settle until DC component s are 0) and measuring the Irms of each node in the interconnect afterward. However, considering the increasing number of nets in a design, this technique is very cpu-extensive. In other words, the need to simulate unnecessary extra cycles slows down the process. In addition, this method cannot filter out lots of good nets until the transient analysis is performed.

Figure 1:
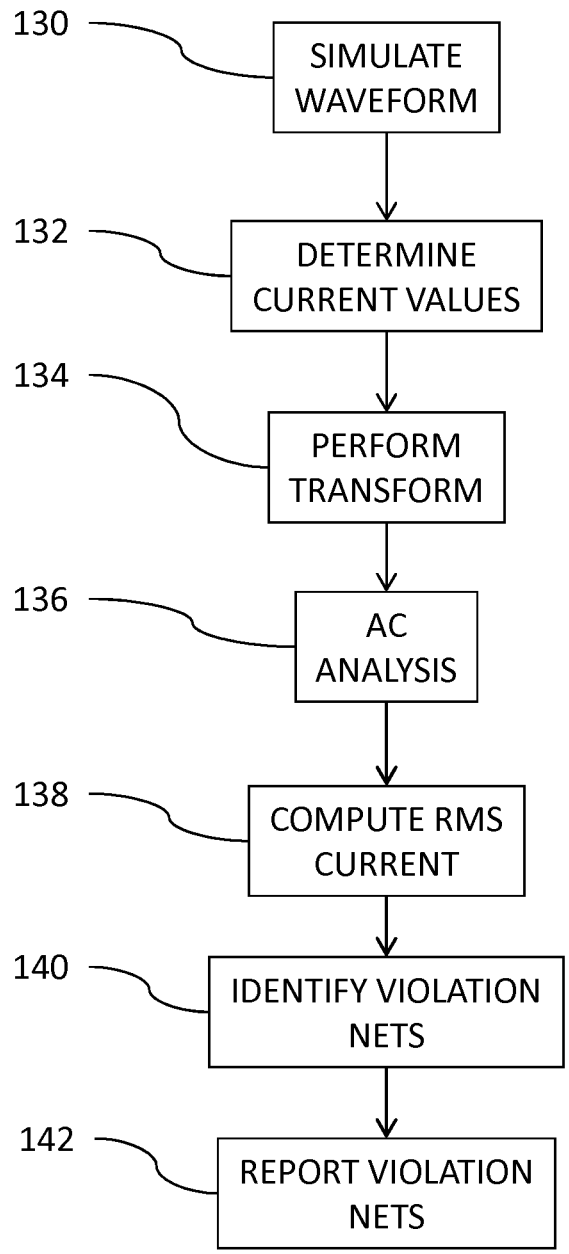
FIG. 1 is a flow diagram illustrating various method embodiments herein.

Therefore, the embodiments herein provide an efficient technique based on AC analysis to measure Irms without losing any accuracy. More specifically, FIG. 1 illustrates a computer-implemented method for performing reliability analysis of an integrated circuit design according to embodiments herein. This method efficiently computes the RMS currents on the VLSI circuit wires and checks whether current limits are exceeded. The method is performed using a computerized device.

As shown in item 130 in FIG. 1, the method simulates a periodic voltage waveform in a network model of the integrated circuit design. Because AC is utilized, the periodic voltage waveform can be simulated within a single clock cycle (or more cycles) of the integrated circuit design. With the AC analysis, there is no need to wait for the current to settle, and the analysis can be completed more quickly, using less CPU resources.

The method then determines resultant current values in each segment of the nets of the integrated circuit design resulting from the periodic voltage waveform in item 132. The nets comprise each segment modeled as sets of resisters and capacitors connected between voltage sources and one or more capacitive output loads.

In item 134, the method performs a Fourier transform of the periodic voltage waveform to generate a frequency domain representation of the periodic voltage waveform. The frequency domain representation comprises multiple Fourier terms, each of the Fourier terms comprise a frequency that is a multiple of the base frequency. There may be, for example, 4-5 terms per voltage waveform.

Next, in item 136, the method performs an AC analysis of the resultant voltage at each frequency of the multiple Fourier terms. The AC analysis provides an electrical current value for each of the frequencies of the Fourier terms for each of the nets. This allows the method to compute a root mean square current through each of the nets in item 138 based on the AC analysis. Then, the method determines whether the root mean square current for any of the segments of the nets exceeds a current limit in item 140. Each root mean square current is computed by taking the square root of summation of squared currents in each of the segments of the nets and the method reports any segment of the nets for which the root mean square current exceeds the current limit in item 142. The root mean square current in a segment is obtained by summation of all square absolute values of frequency components of current in that segment resulting from each of the AC analysis and then takes the square root of the summation. The RMS of the current in a wire calculated by the method in the invention is not limited to determining the danger of electromigration in the wire itself. It is used to determine the increase in temperature in adjacent wires and thus the potential for electromigration in those wires. Further, the periodic pattern is not limited to one clock cycle. Any multiple cycle pattern is applicable as long as it is considered periodic.

In the above processing, the AC analysis is more efficient than even a one cycle transient analysis. In addition, the AC analysis results refer directly to the steady-state condition, and there is no need to simulate over 10 or more cycles. Therefore, AC analysis technique is employed to perform Irms calculation with embodiments herein.

Figure 2:
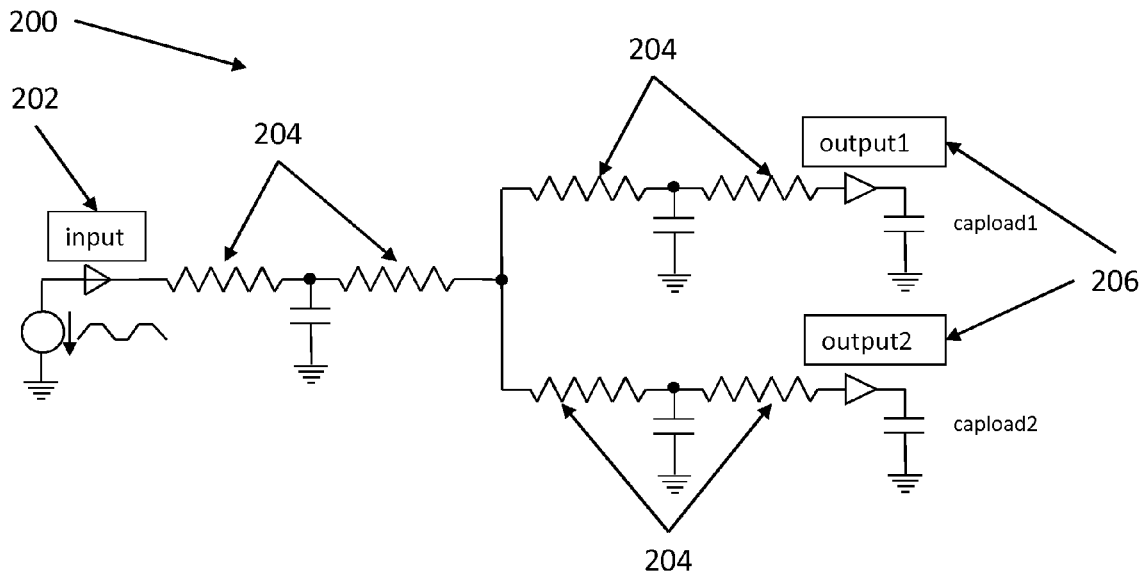
FIG. 2 is a schematic diagram illustrating various embodiments herein.
Figure 3:
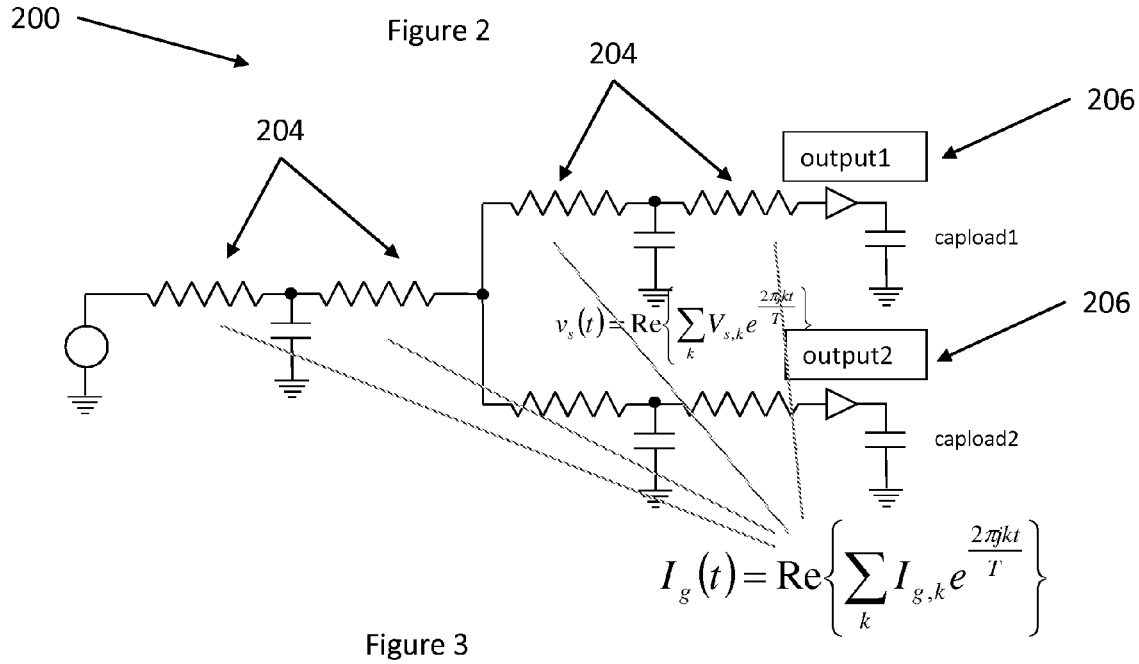
FIG. 3 is a schematic diagram illustrating various embodiments herein.

As shown in FIG. 2, the embodiments herein provide a filtering process that can be used to filter out the good nets depending on the total power consumed. More specifically, FIG. 2 illustrates a portion of an integrated circuit design 300 that includes an input 302, various resistive circuitry 304, and various outputs 306. Because the electrical current values are accumulated by processing step 138, discussed above, the total power consumed during one transition of all the resistors 304 in the portion of the integrated circuit design 300 that is illustrated in FIG. 2. For example, the following equation can be utilized to calculate the total power consumption:

$$P = \sum_{k \in G} r_k i_{rms,k}^2 = -\frac{1}{2T} \sum_{k \in C} c_k \Delta v_{c,k} - \frac{1}{T} \int_0^T i_d v_d \, dt;$$

Where:

P is the power dissipated in the integrated circuit;
G is the set of all resistive branches of the circuit;
C is the set of all capacitive branches of the circuit;

T is the base period of the periodic excitation to the circuit;
$r_k$ is resistance of the k-th resesitive branch;
$i_{rms,k}$ is the root-mean-square if the current in the k-th resistive branch;
$c_k$ is the capacitance of the k-th capacitive branch;
$\Delta v_{c,k}$ is the difference between the starting and ending voltages across the k-th capacitive branch;
$i_d$ is the current at the port of the driver component; and
$v_d$ is the voltage at the port of the driver component.

Therefore, as shown above, the total power consumed by the portion of the integrated circuit design 300 can be computed from only the current and voltage of the driver and the state of the capacitors 304 before and after the transition. This formula therefore can be used for easy screening for valid nets. More specifically, if the total power consumed is less than a predetermined value for a given net, the net can be considered valid as there will be no reliability issues with individual segments within the net.

Alternatively, the embodiments herein can perform a wire by wire analysis using, for example, the following equation where the resulting squared currents for each of the different components are combined:

$$I_{rms,g} = \sqrt{\sum_k |I|^2_{g,k}} \; ;$$

Where:
$I_{rms,g}$ is the total root-mean-square value of the current in the g-th branch; and
$I_{g,k}$ is the complex phasor representation of the k-th Fourier component of the current in the g-th branch.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
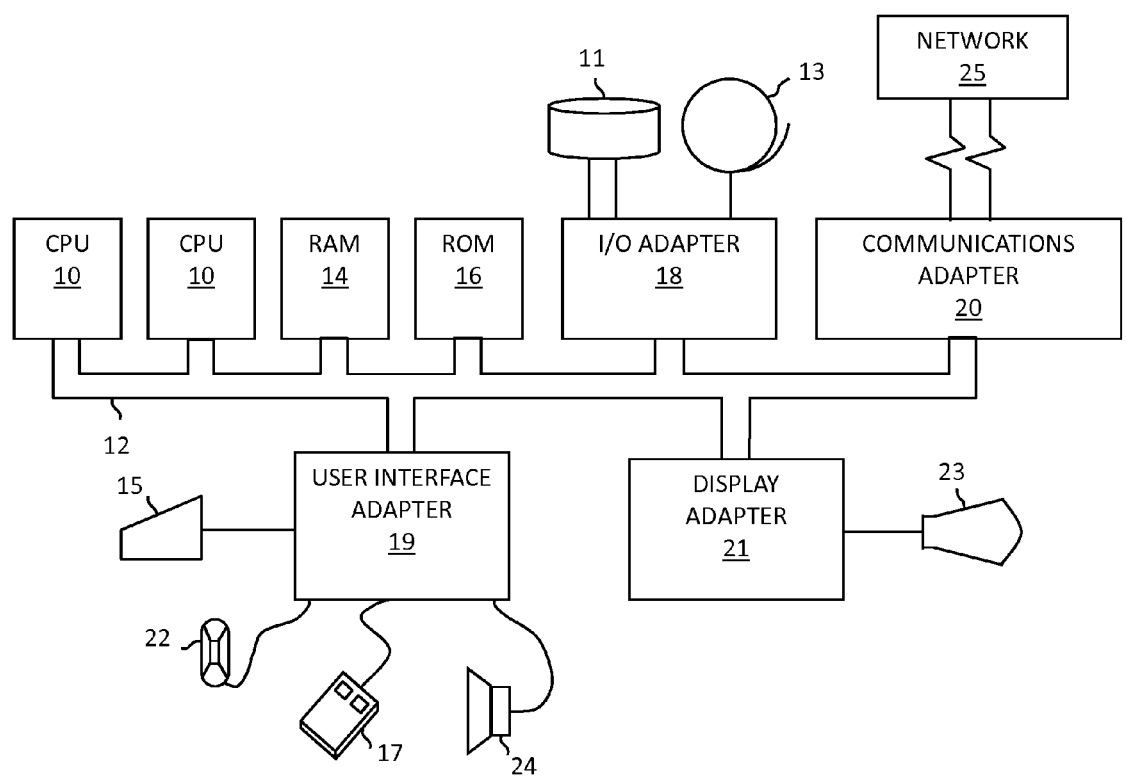
FIG. 4 is a schematic diagram of a hardware diagram according to embodiments herein.

A representative hardware environment for practicing the embodiments of the invention is depicted in FIG. 4. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment Types include loading directly in the client, server and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 5:
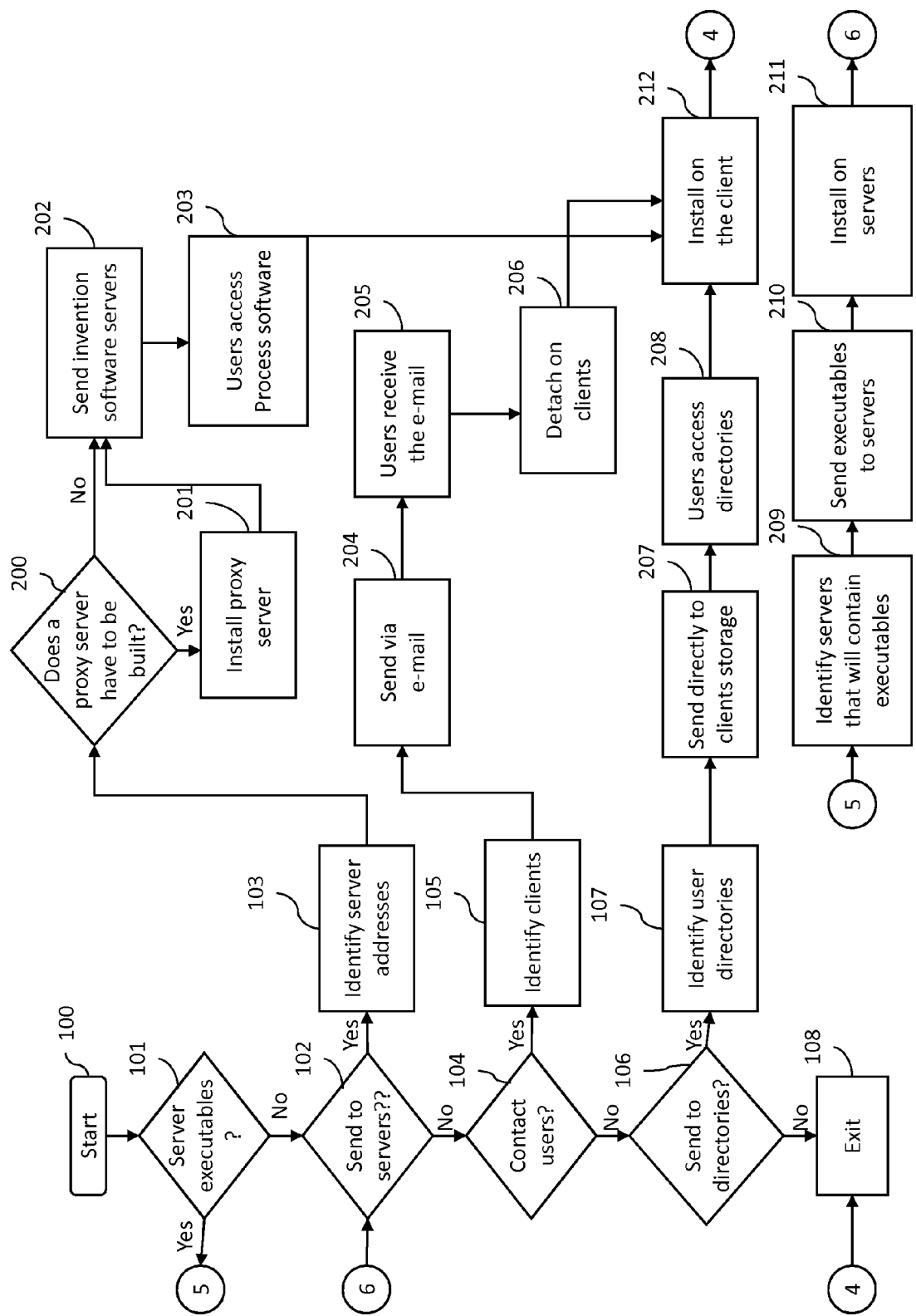
FIG. 5 is a schematic deployment diagram according to embodiments herein.

As shown in FIG. 5, step 100 begins the deployment of the process software. The first thing is to determine if there are any programs that will reside on a server or servers when the process software is executed 101. If this is the case then the servers that will contain the executables are identified 209. The process software for the server or servers is transferred directly to the servers' storage via FTP or some other protocol or by copying though the use of a shared file system 210. The process software is then installed on the servers 211.

Next, a determination is made on whether the process software is be deployed by having users access the process software on a server or servers 102. If the users are to access the process software on servers then the server addresses that will store the process software are identified 103.

A determination is made if a proxy server is to be built 200 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required then the proxy server is installed 201. The process software is sent to the servers either via a protocol such as FTP or it is copied directly from the source files to the server files via file sharing 202. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 203. Another embodiment is to have the servers automatically copy the process software to each client and then run the installation program for the process software at each client computer. The user executes the program that installs the process software on his client computer 212 then exits the process 108.

In step 104 a determination is made whether the process software is to be deployed by sending the process software to users via e-mail. The set of users where the process software will be deployed are identified together with the addresses of the user client computers 105. The process software is sent via e-mail to each of the user's client computers. The users then receive the e-mail 205 and then detach the process software from the e-mail to a directory on their client computers 206. The user executes the program that installs the process software on his client computer 212 then exits the process 108.

Lastly, a determination is made on whether to the process software will be sent directly to user directories on their client computers 106. If so, the user directories are identified 107. The process software is transferred directly to the user's client computer directory 207. This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software 208. The user executes the program that installs the process software on his client computer 212 then exits the process 108.

The process software which consists of is integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely, parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 6:
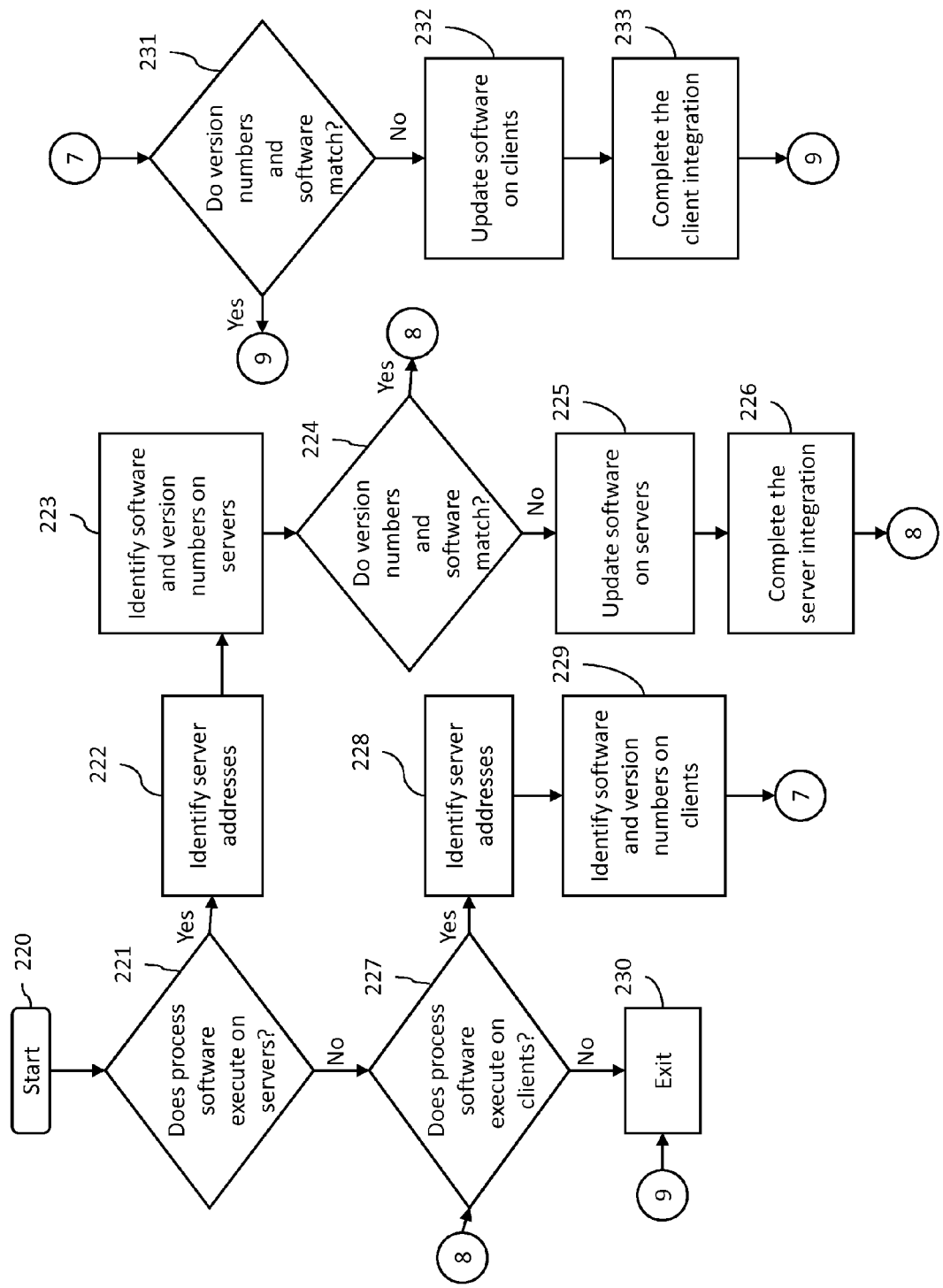
FIG. 6 is a schematic integration diagram according to embodiments herein.

As shown in FIG. 6, step 220 begins the integration of the process software. The first thing is to determine if there are any process software programs that will execute on a server or servers 221. If this is not the case, then integration proceeds to 227. If this is the case, then the server addresses are identified 222. The servers are checked to see if they contain software that includes the operating system (OS), applications, and network operating systems (NOS), together with their version numbers that have been tested with the process software 223. The servers are also checked to determine if there is any missing software that is required by the process software 223.

A determination is made if the version numbers match the version numbers of OS, applications and NOS that have been tested with the process software 224. If all of the versions match and there is no missing required software the integration continues in 227.

If one or more of the version numbers do not match, then the unmatched versions are updated on the server or servers with the correct versions 225. Additionally, if there is missing required software, then it is updated on the server or servers 225. The server integration is completed by installing the process software 226.

Step 227 which follows either 221, 224, or 226 determines if there are any programs of the process software that will execute on the clients. If no process software programs execute on the clients, the integration proceeds to 230 and exits. If this not the case, then the client addresses are identified 228.

The clients are checked to see if they contain software that includes the operating system (OS), applications, and network operating systems (NOS), together with their version numbers, that have been tested with the process software 229. The clients are also checked to determine if there is any missing software that is required by the process software 229.

A determination is made as to whether the version numbers match the version numbers of OS, applications and NOS that have been tested with the process software 231. If all of the versions match and there is no missing required software, then the integration proceeds to 230 and exits.

If one or more of the version numbers do not match, then the unmatched versions are updated on the clients with the correct versions 232. In addition, if there is missing required software then it is updated on the clients 232. The client integration is completed by installing the process software on the clients 233. The integration proceeds to 230 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise when other measurements of use such as network bandwidth, memory usage, storage usage, etc. approach a capacity so as to effect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization and it is scalable, providing capacity on demand in a payas-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise when other measurements of use such as network bandwidth, memory usage, storage usage, etc. approach a capacity so as to effect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 7:
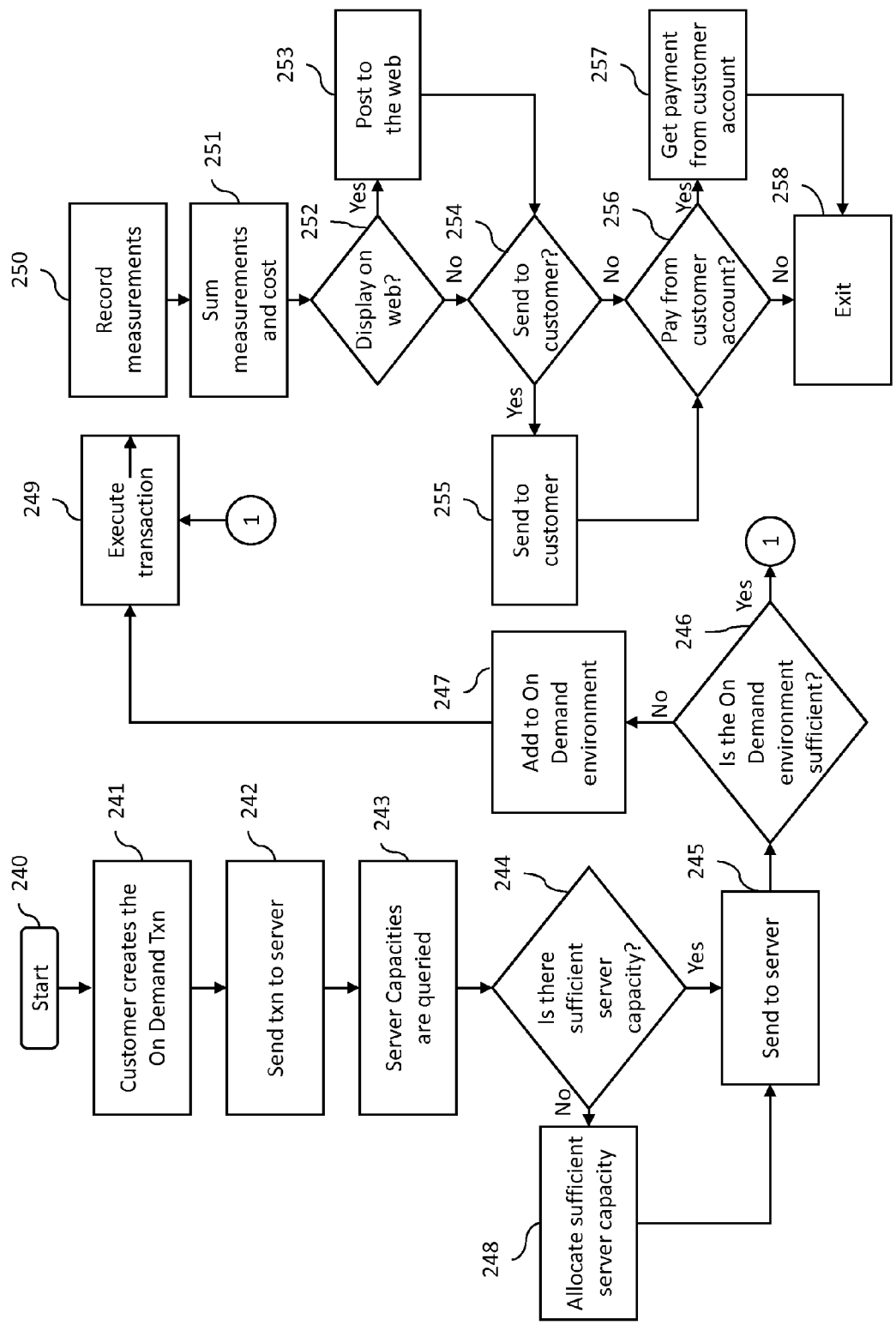
FIG. 7 is a schematic on-demand diagram according to embodiments herein.

As shown in FIG. 7, step 240 begins the On Demand process. A transaction is created than contains the unique customer identification, the requested service type and any service parameters that further specify the type of service 241. The transaction is then sent to the main server 242. In an On Demand environment the main server can initially be the only server, then as capacity is consumed other servers are added to the On Demand environment.

The server central processing unit (CPU) capacities in the On Demand environment are queried 243. The CPU requirement of the transaction is estimated, then the servers available CPU capacity in the On Demand environment are compared to the transaction CPU requirement to see if there is sufficient CPU available capacity in any server to process the transaction 244. If there is not sufficient server CPU available capacity, then additional server CPU capacity is allocated to process the transaction 248. If there was already sufficient Available CPU capacity then the transaction is sent to a selected server 245.

Before executing the transaction, a check is made of the remaining On Demand environment to determine if the environment has sufficient available capacity for processing the transaction. This environment capacity consists of such things as but not limited to network bandwidth, processor memory, storage etc. 246. If there is not sufficient available capacity, then capacity will be added to the On Demand environment 247. Next the required software to process the transaction is accessed, loaded into memory, then the transaction is executed 249.

The usage measurements are recorded 250. The usage measurements consists of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer 251. If the customer has requested that the On Demand costs be posted to a web site 252 then they are posted 253.

If the customer has requested that the On Demand costs be sent via e-mail to a customer address 254 then they are sent 255. If the customer has requested that the On Demand costs be paid directly from a customer account 256 then payment is received directly from the customer account 257. The last step is exit the On Demand process.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling, which is the process of placing an entire packet within another packet and sending it over a network. The protocol of the outer packet is understood by the network and both points, called tunnel interfaces, where the packet enters and exits the network.

Figure 8:
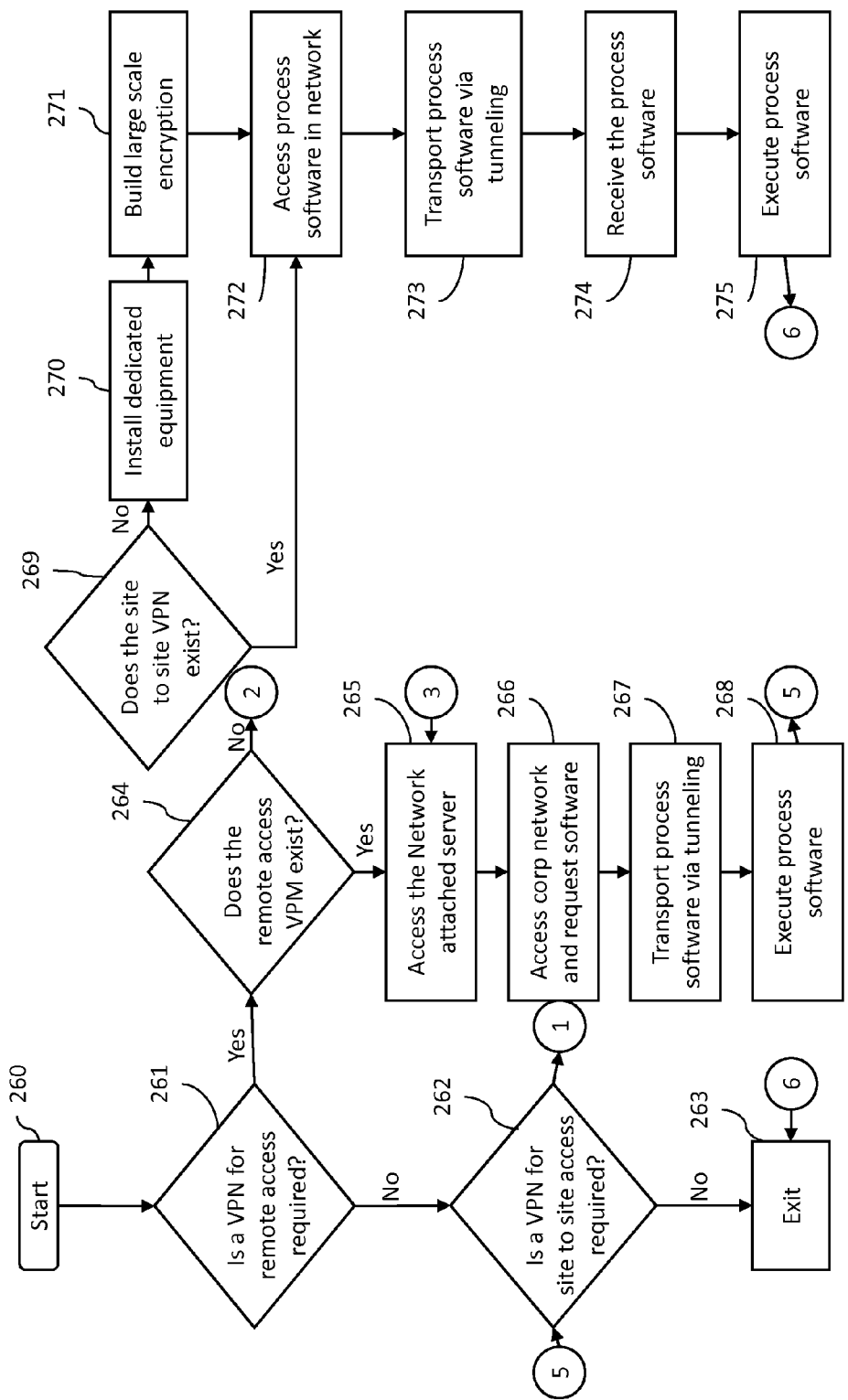
FIG. 8 is a schematic open VPN diagram according to embodiments herein.

As shown in FIG. 8, step 260 begins the Virtual Private Network (VPN) process. A determination is made to see if a VPN for remote access is required 261. If it is not required, then proceed to 262. If it is required, then determine if the remote access VPN exists 264.

If it does exist, then proceed to 265. Otherwise identify the third party provider that will provide the secure, encrypted connections between the company's private network and the company's remote users 276. The company's remote users are identified 277. The third party provider then sets up a network access server (NAS) 278 that allows the remote users to dial a toll free number or attach directly via a cable or DSL modem to access, download and install the desktop client software for the remote-access VPN 279.

After the remote access VPN has been built or if it been previously installed, the remote users can then access the process software by dialing into the NAS or attaching directly via a cable or DSL modem into the NAS 265. This allows entry into the corporate network where the process software is accessed 266. The process software is transported to the remote user's desktop over the network via tunneling. That is the process software is divided into packets and each packet including the data and protocol is placed within another packet 267. When the process software arrives at the remote user's desktop, it is removed from the packets, reconstituted and then is executed on the remote users desktop 268.

A determination is made to see if a VPN for site to site access is required 262. If it is not required, then proceed to exit the process 263. Otherwise, determine if the site to site VPN exists 269. If it does exist, then proceed to 272. Otherwise, install the dedicated equipment required to establish a site to site VPN 270. Then build the large scale encryption into the VPN 271.

After the site to site VPN has been built or if it had been previously established, the users access the process software via the VPN 272. The process software is transported to the site users over the network via tunneling. That is the process software is divided into packets and each packet including the data and protocol is placed within another packet 274. When the process software arrives at the remote user's desktop, it is removed from the packets, reconstituted and is executed on the site users desktop 275. Proceed to exit the process 263.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method for performing reliability analysis of an integrated circuit design, said method comprising:
   simulating a periodic voltage waveform in a network model of said integrated circuit design, using a computerized device;
   determining resultant current values in each segment of nets of said integrated circuit design resulting from said periodic voltage waveform, using said computerized device;
   performing a Fourier transform of said periodic voltage waveform to generate a frequency domain representation of said periodic voltage waveform, using said computerized device, said frequency domain representation comprising multiple Fourier terms, each of said Fourier terms comprising a frequency that is a multiple of said periodic voltage waveform;
   performing an AC analysis of said integrated circuit at each frequency of said Fourier terms, using said computerized device, said AC analysis providing an electrical current value for each of said frequencies of said Fourier terms for each of said nets;
   computing a root mean square current through each said segment of said nets based on said AC analysis, using said computerized device; and
   determining whether said root mean square current for any said segment of said nets exceeds a current limit, using said computerized device; and
   reporting any said segment of said nets for which said root mean square current exceeds said current limit, using said computerized device.

2. The method according to claim 1, said nets comprising said segments modeled as sets of resisters and capacitors connected between voltage sources and one or more capacitive output loads.

3. The method according to claim 1, wherein each root mean square current in a segment is obtained by summation of all square absolute values of frequency components of current in said segment resulting from each said AC analysis and then taking a square root of said summation.

4. The method according to claim 1, further comprising determining increases in temperature for adjacent wires within said integrated circuit design based on said root mean square current to provide an estimate of electro-migration of said adjacent wires.

5. The method according to claim 1, said periodic voltage waveform being simulated within one or more clock cycles of said integrated circuit design.

6. A computer-implemented method for performing reliability analysis of an integrated circuit design, said method comprising:
   simulating a periodic waveform in a network model of said integrated circuit design, using a computerized device;
   determining resultant current values in each segment of nets of said integrated circuit design resulting from said periodic waveform, using said computerized device;
   performing a transform of said periodic waveform to generate a frequency domain representation of said periodic waveform, using said computerized device, said frequency domain representation comprising multiple terms, each of said terms comprise a frequency that is a multiple of said periodic waveform;
   performing an AC analysis of said integrated circuit at each frequency of said multiple terms, using said computerized device, said AC analysis providing an electrical current value for each of said frequencies of said terms for each of said nets; and
   computing a root mean square current through each of nets based on said AC analysis, using said computerized device.

7. The method according to claim 6, said nets comprising said each segment modeled as sets of resisters and capacitors connected between voltage sources and one or more capacitive output loads.

8. The method according to claim 6, wherein each root mean square current in a segment is obtained by summation of all square absolute values of frequency components of current in said segment resulting from each said AC analysis and then taking a square root of said summation.

9. The method according to claim 6, further comprising determining increases in temperature for adjacent wires within said integrated circuit design based on said root mean square current to provide an estimate of electro-migration of said adjacent wires.

10. The method according to claim 6, said periodic waveform being simulated within one or more clock cycles of said integrated circuit design.

11. A system for performing reliability analysis of an integrated circuit design, said system comprising:
    a power supply;
    a non-transitory computer readable storage medium operatively connected to said power supply, said non-transitory computer readable storage medium storing instructions and an integrated circuit design;
    a communications port operatively connected to said power supply; and
    a processor operatively connected to said power supply, to said non-transitory computer readable storage medium, and to said communications port,
    said processor executing said instructions to simulating a periodic voltage waveform in a network model of said integrated circuit design;
    said processor executing said instructions to determine resultant current values in each segment of nets of said integrated circuit design resulting from said periodic voltage waveform;
    said processor executing said instructions to perform a Fourier transform of said periodic voltage waveform to generate a frequency domain representation of said periodic voltage waveform, said frequency domain representation comprising multiple Fourier terms, each of said Fourier terms comprising a frequency that is a multiple of said periodic voltage waveform;
    said processor executing said instructions to perform an AC analysis of said resultant current values at each frequency of said multiple Fourier terms, said AC analysis providing an electrical current value for each of said frequencies of said Fourier terms for each of said nets;
    said processor executing said instructions to compute a root mean square current through each of nets based on said AC analysis; and
    said processor executing said instructions to determine whether said root mean square current for any said segment of said nets exceeds a current limit; and
    said processor executing said instructions to report any said segment of said nets for which said root mean square current exceeds said current limit.

12. The system according to claim 11, said nets comprising said each segment modeled as sets of resisters and capacitors connected between voltage sources and one or more capacitive output loads.

13. The system according to claim 11, wherein each root mean square current in a segment is obtained by summation of all square absolute values of frequency components of current in said segment resulting from each said AC analysis and then taking a square root of said summation.

14. The system according to claim 11, further comprising determining increases in temperature for adjacent wires within said integrated circuit design based on said root mean square current to provide an estimate of electro-migration of said adjacent wires.

15. The system according to claim 11, said periodic voltage waveform being simulated within one or more clock cycles of said integrated circuit design.

16. A non-transitory computer storage medium storing instructions executable by a computer, said instructions causing said computer to perform a method for a reliability analysis of an integrated circuit design, said method comprising:
    simulating a periodic voltage waveform in a network model of said integrated circuit design;
    determining resultant current values in each segment of nets of said integrated circuit design resulting from said periodic voltage waveform;
    performing a Fourier transform of said periodic voltage waveform to generate a frequency domain representation of said periodic voltage waveform, said frequency domain representation comprising multiple Fourier terms, each of said Fourier terms comprising a frequency that is a multiple of said periodic voltage waveform;
    performing an AC analysis of said integrated circuit at each frequency of said multiple Fourier terms, said AC analysis providing an electrical current value for each of said frequencies of said Fourier terms for each of said nets;
    computing a root mean square current through each of nets based on said AC analysis; and
    determining whether said root mean square current for any said segment of said nets exceeds a current limit; and
    reporting any said segment of said nets for which said root mean square current exceeds said current limit.

17. The non-transitory computer storage medium according to claim 16, said nets comprising said each segment modeled as sets of resisters and capacitors connected between voltage sources and one or more capacitive output loads.

18. The non-transitory computer storage medium according to claim 16, wherein each root mean square current in a segment is obtained by summation of all square absolute values of frequency components of current in said segment resulting from each said AC analysis and then taking a square root of said summation.

19. The non-transitory computer storage medium according to claim 16, further comprising determining increases in temperature for adjacent wires within said integrated circuit design based on said root mean square current to provide an estimate of electro-migration of said adjacent wires.

20. The non-transitory computer storage medium according to claim 16, said periodic voltage waveform being simulated within one or more clock cycles of said integrated circuit design.

* * * * *